US010156335B1

(12) United States Patent
Li et al.

(10) Patent No.: US 10,156,335 B1
(45) Date of Patent: Dec. 18, 2018

(54) LIGHT-EMITTING DEVICE

(71) Applicant: EPISTAR CORPORATION, Hsinchu (TW)

(72) Inventors: Jun-Yi Li, Hsinchu (TW); Chun-Yu Lin, Hsinchu (TW); Shih-Chang Lee, Hsinchu (TW); Yi-Ming Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/666,110

(22) Filed: Aug. 1, 2017

(51) Int. Cl.
*H01L 33/60* (2010.01)
*F21S 43/14* (2018.01)
*H01L 33/00* (2010.01)
*G08G 1/095* (2006.01)
*H01L 33/42* (2010.01)

(52) U.S. Cl.
CPC .......... *F21S 43/14* (2018.01); *H01L 33/0062* (2013.01); *H01L 33/60* (2013.01); *G08G 1/095* (2013.01); *H01L 33/42* (2013.01)

(58) Field of Classification Search
CPC ...... H01L 33/0062; H01L 33/60; H01L 33/42
See application file for complete search history.

(56) References Cited

U.S. PATENT DOCUMENTS

| 6,384,430 B1* | 5/2002 | Nakatsu | H01L 33/0025 |
| | | | 257/103 |
| 8,716,693 B2* | 5/2014 | Son | H01L 33/06 |
| | | | 257/13 |
| 2007/0170459 A1* | 7/2007 | Kyono | B82Y 20/00 |
| | | | 257/103 |

* cited by examiner

*Primary Examiner* — Mark Tornow
(74) *Attorney, Agent, or Firm* — Muncy, Geissler, Olds & Lowe, P.C.

(57) ABSTRACT

A light-emitting device comprises a semiconductor structure comprising a first conductivity-type semiconductor layer, a second conductivity-type semiconductor layer, a first intermediate layer, a second intermediate layer, and an active region capable of emitting radiation, wherein the active region is between the first intermediate layer and the second intermediate layer, the first intermediate layer is in direct contact with the first conductivity-type semiconductor layer, the second intermediate layer is in direct contact with the second conductivity-type semiconductor layer, and the active region comprises alternated well layers and barrier layers, wherein each barrier layer has a thickness; wherein a first difference between a refractive index of the first intermediate layer and a refractive index of the first conductivity-type semiconductor layer is less than a second difference between a refractive index of the second intermediate layer and a refractive index of the second conductivity-type semiconductor layer.

20 Claims, 3 Drawing Sheets

LIGHT-EMITTING DEVICE

TECHNICAL FIELD

The disclosure relates to a light-emitting device, and particularly to a light-emitting device comprising an intermediate layer.

DESCRIPTION OF BACKGROUND ART

Light-emitting diodes (LEDs) are widely used as solid-state light sources. Compared to conventional incandescent light lamps or fluorescent light tubes, LEDs have advantages such as lower power consumption and longer lifetime, and therefore LEDs gradually replace the conventional light sources and are applied to various fields such as traffic lights, back light modules, street lighting, and biomedical device.

SUMMARY OF THE DISCLOSURE

The present disclosure provides a light-emitting device. The light-emitting device a semiconductor structure comprises a semiconductor structure comprising a first conductivity-type semiconductor layer, a second conductivity-type semiconductor layer, a first intermediate layer having a first thickness, a second intermediate layer having a second thickness, and an active region capable of emitting radiation, wherein the active region is between the first intermediate layer and the second intermediate layer, the first intermediate layer is in direct contact with the first conductivity-type semiconductor layer, the second intermediate layer is in direct contact with the second conductivity-type semiconductor layer, and the active region comprises alternated well layers and barrier layers, wherein each barrier layer has a thickness; wherein a first difference between a refractive index of the first intermediate layer and a refractive index of the first conductivity-type semiconductor layer is less than a second difference between a refractive index of the second intermediate layer and a refractive index of the second conductivity-type semiconductor layer, and the first thickness and the second thickness are both greater than the thickness of one of the barrier layers.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein.

DETAILED DESCRIPTION OF PREFERRED EMBODIMENTS

Figure 1:
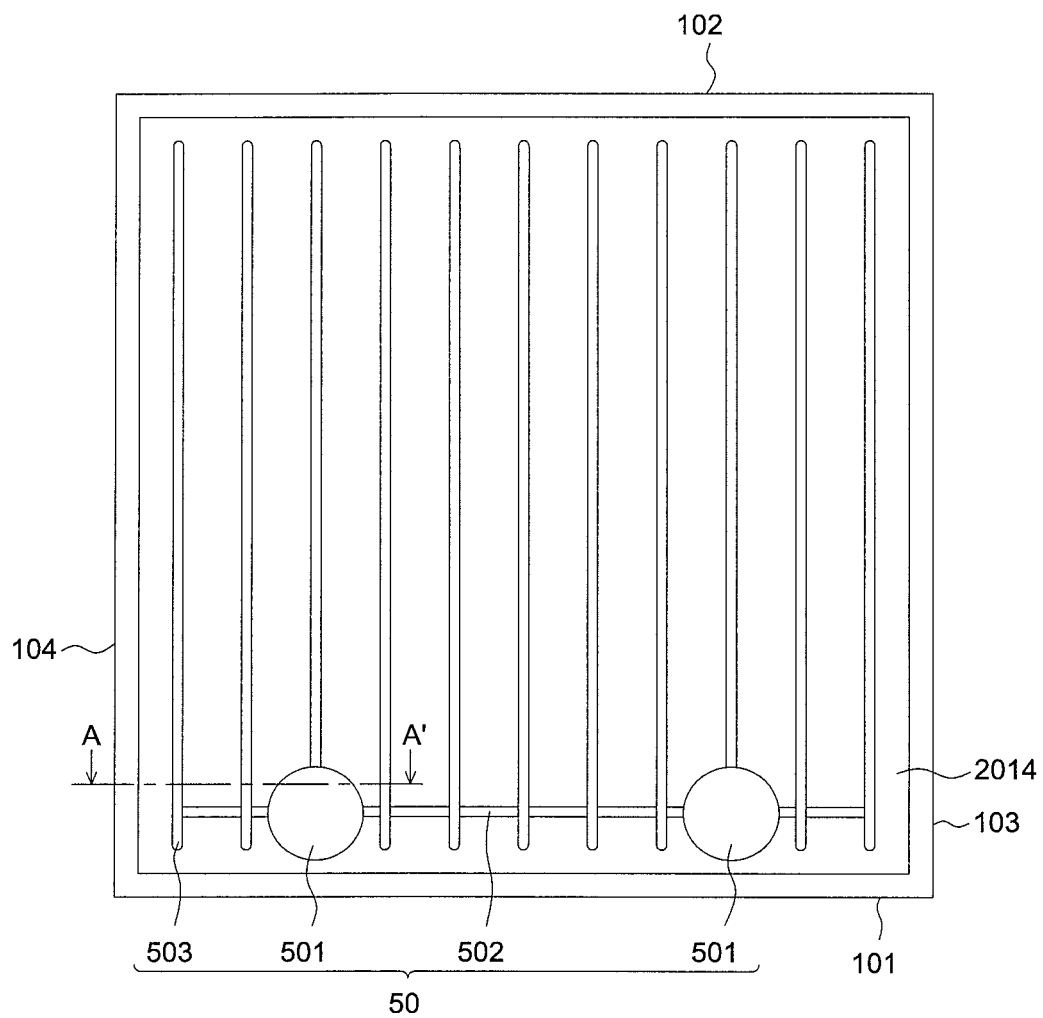
FIG. 1 is a top view of a light-emitting device in accordance with one embodiment of the present application.

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

In the present disclosure, if not specifically mention, the general expression of AlGaAs means $Al_xGa_{(1-x)}As$, wherein $0 \le x \le 1$; the general expression of AlInP means $Al_xIn_{(1-x)}P$, wherein $0 \le x \le 1$; the general expression of AlGaInP means $(Al_yGa_{(1-y)})_{1-x}In_xP$, wherein $0 \le x \le 1$, $0 \le y \le 1$; the general expression of AlGaN means $Al_xGa_{(1-x)}N$, wherein $0 \le x \le 1$; the general expression of AlAsSb means $AlAs_{(1-x)}Sb_x$ wherein $0 \le x \le 1$ and the general expression of InGaP means $In_xGa_{1-x}P$, wherein $0 \le x \le 1$; the general expression of InGaAsP means $In_xGa_{1-x}As_{1-y}P_y$, wherein $0 \le x \le 1$, $0 \le y \le 1$; the general expression of InGaAsN means $In_xGa_{1-x}As_{1-y}N_y$, wherein $0 \le x \le$, $0 \le y \le 1$; the general expression of AlGaAsP means $Al_xGa_{1-x}As_{1-y}P_y$, wherein $0 \le x \le 1$, $0 \le y \le 1$; the general expression of InGaAs means $In_xGa_{1-x}As$, wherein $0 \le x \le 1$; the general expression of AlGaN means $Al_xGa_{1-x}N$, wherein $0 \le x \le 1$; the general expression of InGaN means $In_xGa_{1-x}N$, wherein $0 \le x \le 1$; the general expression of InAlGaN means $In_xAl_yGa_{1-x-y}N$, wherein $0 \le x \le 1$, $0 \le y \le 1$. The content of the element can be adjusted for different purposes, such as, but not limited to, matching the lattice constant of the growth substrate or adjusting the peak wavelength or the dominant wavelength.

Figure 2:
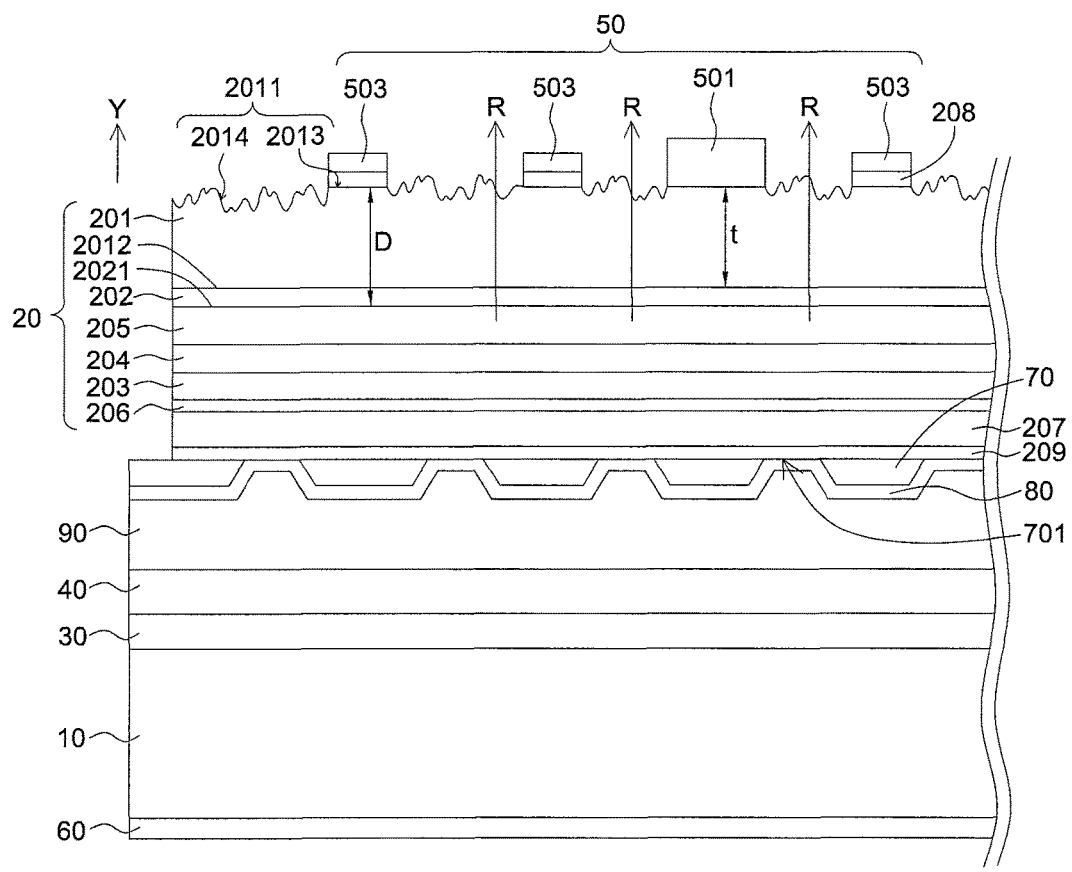
FIG. 2 is a cross-sectional diagram along an A-A' line of the light-emitting device shown in FIG. 1.

FIG. 1 is a top view of a light-emitting device in accordance with one embodiment of the present application. FIG. 2 is a cross-sectional diagram along an A-A' line of the light-emitting device shown in FIG. 1. As shown in FIG. 1 and FIG. 2, the light-emitting device comprises a substrate 10, a semiconductor structure 20 on the substrate 10, a bonding layer 30 between the substrate 10 and the semiconductor structure 20, a reflecting layer 40 between the semiconductor structure 20 and the bonding layer 30, a first electrode 50 on the semiconductor structure 20, and a second electrode 60 on the side opposite to the first electrode 50. The semiconductor structure 20 comprises a first conductivity-type semiconductor layer 201, a first intermediate layer 202, a second conductivity-type semiconductor layer 203, a second intermediate layer 204 and an active region 205. The active region 205 is between the first conductivity-type semiconductor layer 201 and the second conductivity-type semiconductor layer 203 and is capable of emitting radiation R. The first intermediate layer 202 is between the first conductivity-type semiconductor layer 201 and the active region 205. The second intermediate layer 204 is between the second conductivity-type semiconductor layer 203 and the active region 205. Preferably, the first intermediate layer 202 is in direct contact with the first conductivity-type semiconductor layer 201, and the second intermediate layer 204 is in direct contact with the second conductivity-type semiconductor layer 203. Specifically, no layers intervene between the first intermediate layer 202 and the first conductivity-type semiconductor layer 201, and no layers intervene between the second intermediate layer 204 and the second conductivity-type semiconductor layer 203. A first difference between a refractive index of the first intermediate layer 202 and a refractive index of the first conductivity-type semiconductor layer 201 is less than a second difference between a refractive index of the second intermediate layer 204 and a refractive index of the second conductivity-type semiconductor layer 203. Preferably, a difference between the first difference and the second difference is not less than 0.1, and preferably, is not more than 0.5, and more preferably, is between 0.2 and 0.4 both inclusive. The radiation R mainly escapes from the light-emitting device through the side of the active region 205 where the first intermediate layer 202 and the first conductivity-type semiconductor layer 201 are situated. Accordingly, the light-extraction efficiency of the light-emitting device in accordance with the present disclosure can be improved. Preferably, the first intermediate layer 202 and the first conductivity-type semiconductor layer 201 are on the side of the active region 205 opposite to the reflecting layer 40. Accordingly, the light-extraction efficiency of the light-emitting device can be further improved.

Referring to FIG. 1, in one embodiment, the substrate 10 has a first side 101, a second side 102 opposite to the second side 102, a third side 103 and a fourth side 104 between the first side 101 and the second side 102. The first electrode 50 comprises multiple electrode pads 501, a first extension 502 and multiple second extensions 503. Specifically, the multiple electrode pads 501 are nearer the first side 101 than the second side 102. The first extension 502 connects the multiple electrode pads 501 and comprising two ends (not labeled) extending from the multiple electrode pads 501 toward the third side 103 and the fourth side 104 respectively. Some of the second extensions 503 connect the first extension 502 and extends toward the second side 102. Other second extensions 503 extend from the multiple electrode pads 501 toward the second side 102. The pattern of the first electrode 50 is not limited to the present disclosure.

In one embodiment, the first conductivity-type semiconductor layer 201 comprises an n-type semiconductor for providing electrons. The second conductivity-type semiconductor layer 203 comprises a p-type semiconductor for providing holes. The n-type dopant can be Si or Te. The p type dopant can be C, Zn or Mg.

In one embodiment, the active region 205 comprises a single heterostructure (SH), a double heterostructure (DH), a double-side double heterostructure (DDH) or a multi-quantum well (MQW) structure. Preferably, the active region 205 comprises a multi-quantum well (MQW) structure comprising alternated well layers (not shown) and barrier layers (not shown), and each of the barrier layers has a thickness. The first intermediate layer 202 has a first thickness. The second intermediate layer 204 has a second thickness. The first thickness and the second thickness are both greater than the thickness of one of the barrier layers. Preferably, the first thickness and the second thickness are both greater than the thicknesses of any barrier layer. Preferably, the first thickness and the second thickness are at least 50 nm greater than the thickness of one of the barrier layers. More preferably, a difference between the first thickness and the thickness of one of the barrier layers and/or a difference between the second thickness and the thickness of one of the barrier layer is between 50 nm and 120 nm both inclusive, and more preferably, between 50 nm and 80 nm both inclusive. More preferably, a difference between the first thickness and the thickness of any barrier layer and/or a difference between the second thickness and the thickness of any barrier layer is between 50 nm and 120 nm both inclusive, and more preferably, between 50 nm and 80 nm both inclusive, for preventing the dopant of the first conductivity-type semiconductor layer 201 and/or the second conductivity-type semiconductor layer 203 diffusing in to the active region. In one embodiment, the thickness of one of the barrier layers is not less than 5 nm, and more preferably, not more than 30 nm. In one embodiment, the second thickness and/or the first thickness is between 50 nm and 120 nm both inclusive for preventing the dopant of the first conductivity-type semiconductor layer 201 and/or the second conductivity-type semiconductor layer 203 diffusing in to the active region. In one embodiment, the first conductivity-type semiconductor layer 201 has a thickness greater than a thickness of the second conductivity-type semiconductor layer 203. Preferably, a difference between a thickness of the first conductivity-type semiconductor layer 201 and the second conductivity-type semiconductor layer 203 is greater than 1000 nm, and preferably, not more than 3000 nm. In one embodiment, the first conductivity-type semiconductor layer 201 comprises a top surface 2011 and a lower surface 2012. The top surface 2011 is opposite to the lower surface 2012 and facing the first electrode 50. The top surface 2011 is farther from the active region 205 than the lower surface 2012. The top surface 2011 comprises an even portion 2013 and a rough portion 2014 adjacent to the even portion 2013 and not covered by the first electrode 50. The rough portion 2014 may be for reducing the total internal reflection between the semiconductor structure 20 and the ambient environment. The rough portion 2014 has a roughness greater than the roughness of the even portion 2013. The first intermediate layer 202 comprises a bottom surface 2021 opposite to the first conductivity-type semiconductor layer 201 and facing the active region 205. In this embodiment, a distance D between the even portion 2013 and the bottom surface 2021 is not more than 3500 nm, and preferably, is not less than 1000 nm. Accordingly, the light-extraction efficiency of the light-emitting device in accordance with the present disclosure can be further improved. A thickness t between the even portion 2013 and the lower surface 2012 of the first conductivity-type semiconductor layer 201 is greater than a thickness of the second conductivity-type semiconductor layer 203. Preferably, a difference between the thickness t between the even portion 2013 and the lower surface 2012 of the first conductivity-type semiconductor layer 201 and the thickness of the second conductivity-type semiconductor layer 203 is greater 1000 nm, and not more than 3000 nm, and preferably, between 2000 nm and 3000 nm both inclusive.

In one embodiment, each barrier layer has an energy gap and each well layer has an energy gap. Preferably, the energy gap of one of the barrier layers is greater than the energy gap of one of the well layers. More preferably, the energy gap of any barrier layer is greater than the energy gap of any well layer. Each of the first intermediate layer 202 and the second intermediate layer 204 has an energy gap not lower than the energy gap of one of the barrier layers. Preferably, the energy gap of the first intermediate layer 202 and the energy gap of the second intermediate layer 204 are not lower than the energy gap of any barrier layer. In one embodiment, the energy gap of the first intermediate layer 202 and the energy gap of the second intermediate layer 204 are both greater than the energy gap of one of the barrier layers, and preferably, greater than the energy gap of any barrier layer for reducing the forward voltage of the light-emitting device. In one embodiment, the energy gap of the first conductivity-type semiconductor layer 201 and the energy gap of the second conductivity-type semiconductor layer 203 are both greater than the energy gap of one of the barrier layers, and preferably, greater than the energy gap of any barrier layer. In one embodiment, the energy gap of the first intermediate layer 202 and the energy gap of the second intermediate layer 204 are both greater than the energy gap of the first conductivity-type semiconductor layer 201. In one embodiment, an energy gap of the first intermediate layer 202 is substantially the same as an energy gap of the second intermediate layer 204. Preferably, a third difference between an energy gap of the first intermediate layer 202 and an energy gap of the first conductivity-type semiconductor layer 201 is less than a fourth difference between an energy gap of the second intermediate layer 204 and an energy gap of the second conductivity-type semiconductor layer 203 for both improving the light-extraction efficiency and the internal quantum efficiency.

In one embodiment, the energy gap of the second conductivity-type semiconductor layer 203 is greater than an energy gap of the first conductivity-type semiconductor layer 201. More preferably, the difference between the energy gap of the second conductivity-type semiconductor layer 203 and the energy gap of the first conductivity-type semiconductor layer 201 is not less than 0.05 eV, and preferably, not more than 0.8 eV, and preferably, between 0.05 eV and 0.5 eV both inclusive, for both improving the light-extraction efficiency and the internal quantum efficiency.

In one embodiment, the first conductivity-type semiconductor layer 201, the second conductivity-type semiconductor layer 203, the first intermediate layer 202, the second intermediate layer 204, the barrier layers and the well layers comprise Group III-V semiconductor material such as AlGaAs, AlInP, AlGaInP, AlGaN, AlAsSb, InGaP, InGaAsP, InGaAsN, AlGaAsP, InGaAs, AlGaN, InAlGaN or InGaN. In one embodiment, the first conductivity-type semiconductor layer 201, the second conductivity-type semiconductor layer 203, the first intermediate layer 202 and the second intermediate layer 204 comprises AlGaInP. In one embodiment, the first conductivity-type semiconductor layer 201 comprises $(Al_aGa_{(1-a)})_{1-b}In_bP$, the second conductivity-type semiconductor layer 203 comprises $(Al_cGa_{(1-c)})_{1-d}In_dP$, the first intermediate layer 202 comprises $(Al_eGa_{(1-e)})_{1-f}In_fP$, and the second intermediate layer 204 comprises $(Al_gGa_{(1-g)})_{1-h}In_hP$. Preferably, a<c. More preferably, a<e, g<c. In one embodiment, the barrier layers comprise $(Al_iGa_{(1-i)})_{1-j}In_jP$. In one embodiment, a<i<e, g<c. In one embodiment, i<a<e, g<c, preferably, b, d, f, h and j are substantially the same. Preferably, $0.45 \leq b, d, f, h$ and $j \leq 0.55$. In one embodiment, the first intermediate layer 202 and the second intermediate layer 204 are both undoped for improving the reliability of the light-emitting device.

In one embodiment, the semiconductor structure 20 further comprises a buffer layer 206 under the second conductivity-type semiconductor layer 203. Preferably, the energy gap of the buffer layer 206 is gradually changed in a direction Y from the second conductivity-type semiconductor layer 203 toward the first conductivity-type semiconductor layer 201. In one embodiment, the energy gap of the buffer layer 206 is gradually increased in a direction from the second conductivity-type semiconductor layer 203 toward the first conductivity-type semiconductor layer 201. Specifically, the buffer layer 206 comprises semiconductor material comprising AlGaAs, AlInP, AlGaInP, AlGaN, AlAsSb, InGaP, InGaAsP, InGaAsN, AlGaAsP, InGaAs, AlGaN, InAlGaN or InGaN. Preferably, one of the elements of the buffer layer 206 has an atomic percentage gradually changed in a direction from the second conductivity-type semiconductor layer 203 toward the first conductivity-type semiconductor layer 201. In one embodiment, the buffer layer 206 comprises AlGaInP, wherein Al has an atomic percentage gradually increased in a direction Y from the second conductivity-type semiconductor layer 203 toward the first conductivity-type semiconductor layer 201 and wherein Ga has an atomic percentage gradually decreased in a direction Y from the second conductivity-type semiconductor layer 203 toward the first conductivity-type semiconductor layer 201. In one embodiment, the buffer layer 206 has a thickness between 10 nm and 100 nm both inclusive, and preferably, between 10 nm and 50 nm both inclusive.

In one embodiment, the semiconductor structure 20 further comprises a semiconductor layer 207 between the second conductivity-type semiconductor layer 203 and the substrate 10. In one embodiment, the semiconductor layer is between the buffer layer 206 and the substrate 10. Preferably, the semiconductor layer 207 has a thickness greater than a thickness of the second conductivity-type semiconductor layer 203. In one embodiment, the energy gap of the semiconductor layer 207 is lower than an energy gap of the second conductivity-type semiconductor layer 203. The semiconductor layer 207 may be for spreading current over the active region 205. In one embodiment, the semiconductor layer 207 has a thickness larger than 2000 nm, and preferably, between 2000 nm and 7000 nm both inclusive for spreading current. In another embodiment, the semiconductor layer 207 has a thickness greater than 200 nm, and preferably, less than 500 nm, for both improving current spreading and light extraction efficiency. In one embodiment, the semiconductor layer 207 comprises AlGaInP or AlGaAs. Preferably, the semiconductor layer 207 comprises $(Al_kGa_{(1-k)})_{1-m}In_mP$, wherein k<a<i<e, g<b. In one embodiment, k<i<a<e, g<b.

In one embodiment, the semiconductor structure 20 further comprises a first semiconductor contact layer 208 and a second semiconductor contact layer 209. The first semiconductor contact layer 208 is between the first electrode 50 and the first conductivity-type semiconductor layer 201 such that the first electrode 50 is electrically ohmically connected to the first conductivity-type semiconductor layer 201 through the first semiconductor contact layer 208 for reducing the forward voltage. The second semiconductor contact layer 209 is between semiconductor layer 207 and the substrate 10 such that the second electrode 60 is electrically ohmically connected to the second conductivity-type semiconductor layer 203 through the second semiconductor contact layer 209 for reducing the forward voltage. Preferably, the first semiconductor contact layer 208 is under and overlaps with the first extension 502 and the second extensions 503 in a stacking direction Y of the semiconductor structure 20. More preferably, the first semiconductor contact layer 208 does not overlap with the electrode pads 501. The thickness of the first semiconductor contact layer 208 or the second semiconductor contact layer 209 is less than 150 nm, and preferably, between 50 and 100 nm both inclusive for reducing light absorption by the second semiconductor contact layer 209 and/or the first semiconductor contact layer 208. The doping concentration of the first semiconductor contact layer 208 or the second semiconductor contact layer 209 is greater than $10^{18}/cm^3$, and preferably, between $1\times10^{18}/cm^3$ and $5\times10^{10}/cm^3$ both inclusive. The material of the first semiconductor contact layer 208 and the second semiconductor contact layer 209 comprise Group III-V semiconductor material, such as GaAs, AlGaAs, InGaP, AlGaInP or GaP.

In one embodiment, the light-emitting device further comprises a transparent layer 70 between the second semiconductor contact layer 209 and the reflecting layer 40, multiple recesses 701 formed through the transparent layer 70, and a contact layer 80 formed conformably on the transparent layer 70 and filled in the multiple recesses 701. A part of the contact layer 80 is directly in contact with the second semiconductor contact layer 209 through the multiple recesses 701. The recesses 701 are arranged in twodimension and may have a pattern such as dot array, lines, or net. Preferably, the recesses 701 do not overlapped with the first electrode 50 in a stacking direction Y of the semiconductor structure 20. The transparent layer 70 comprises insulating transparent material with a refractive index less than 2, such as $SiN_x$, $AlO_x$, $SiO_x$ or $MgF_x$. The thickness of the transparent layer 70 is between about 500 Å and 10000 Å both inclusive, and preferably is between about 1000 Å and 6000 Å both inclusive. The contact layer 80 comprises graphene or metal oxide material comprising indium tin oxide (ITO), aluminum zinc oxide (AZO), SnCdO, antimony tin oxide (ATO), ZnO, $Zn_2SnO_4$ (ZTO) or indium zinc oxide (IZO). The contact layer 80 has a thickness not less than 20 Å, and preferably, not greater than 2000 Å, and more preferably, not greater than 200 Å.

In one embodiment, the light-emitting device further comprises a current spreading layer 90 between the reflecting layer 40 and the contact layer 80. The material of the current spreading layer 90 comprise metal oxide material comprising indium tin oxide (ITO), aluminum zinc oxide (AZO), SnCdO, antimony tin oxide (ATO), ZnO, $Zn_2SnO_4$ (ZTO) or indium zinc oxide (IZO). The current spreading layer 90 has a thickness between 1000 Å and 5000 Å both inclusive, and preferably between 1500 Å and 3500 Å both inclusive. The material of the current spreading layer 90 can be the same or different from the material of the contact layer 80. Preferably, the material of the current spreading layer 90 is different from the material of the contact layer 80. In the present embodiment, the current spreading layer 90 comprises IZO.

The reflecting layer 40 comprises a material with a reflectivity greater than 90% for the radiation R emitted from the active region 205. Preferably, the reflecting layer 40 comprises metal, such as Au, Ag, Al or the combinations thereof. The conductive reflector 110 has a thickness between 2500 Å and 7500 Å both inclusive.

In one embodiment, the radiation R has a peak wavelength in the visible wavelength range, and more preferably, the peak wavelength is between 600 nm and 790 nm both inclusive. In another embodiment, the radiation R has a peak wavelength in the invisible wavelength range, and more preferably, the peak wavelength is between 790 nm and 1500 nm both inclusive.

The method of performing epitaxial growth for the semiconductor structure 20 comprises, but is not limited to metal-organic chemical vapor deposition (MOCVD), hydride vapor phase epitaxy (HVPE), molecular beam epitaxy (MBE), or liquid-phase epitaxy (LPE).

The substrate 10 is electrically conductive for conducting a current flowing between the first electrode 50 and the second electrode 60. The substrate 10 has a thickness thick enough for supporting the layers or structures thereon, for example, greater than 100 μm. The substrate 10 comprises a conductive material comprising Si, Ge, Cu, Mo, MoW, AlN, ZnO or $Al_2O_3$. Preferably, the substrate 10 comprises Si.

The bonding layer 30 comprises transparent conducive oxide, metal material, insulating oxide, or polymer. The transparent conducive oxide comprises indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), or indium zinc oxide (IZO). The metal material comprises In, Sn, Au, Ti, Ni, Pt, W or the alloys thereof. The insulating oxide comprises aluminum oxide ($AlO_x$), silicon oxide ($SiO_x$), or silicon oxynitride ($SiO_xN_y$). The polymer comprises epoxy, polyimide, perfluorocyclobutane, benzocyclobutene (BCB) or silicone. The bonding layer 30 has a thickness between 400 nm and 5000 nm both inclusive.

The first electrode 50 and the second electrode 60 are for conducting a current there between. The material of the first electrode 50 and the second electrode 60 comprise transparent conductive material or metal material, wherein the transparent conductive material comprises graphene or transparent conductive oxide, and wherein the metal material comprises Cu, Sn, Au, Ni, Pt, Al, Ti, Cr, Pb, Cu—Sn, Cu—Zn, Cu—Cd, Sn—Pb—Sb, Sn—Pb—Zn, Ni—Sn, Ni—Co, Au alloy, Au—Cu—Ni—Au, or the combinations thereof.

Figure 3:
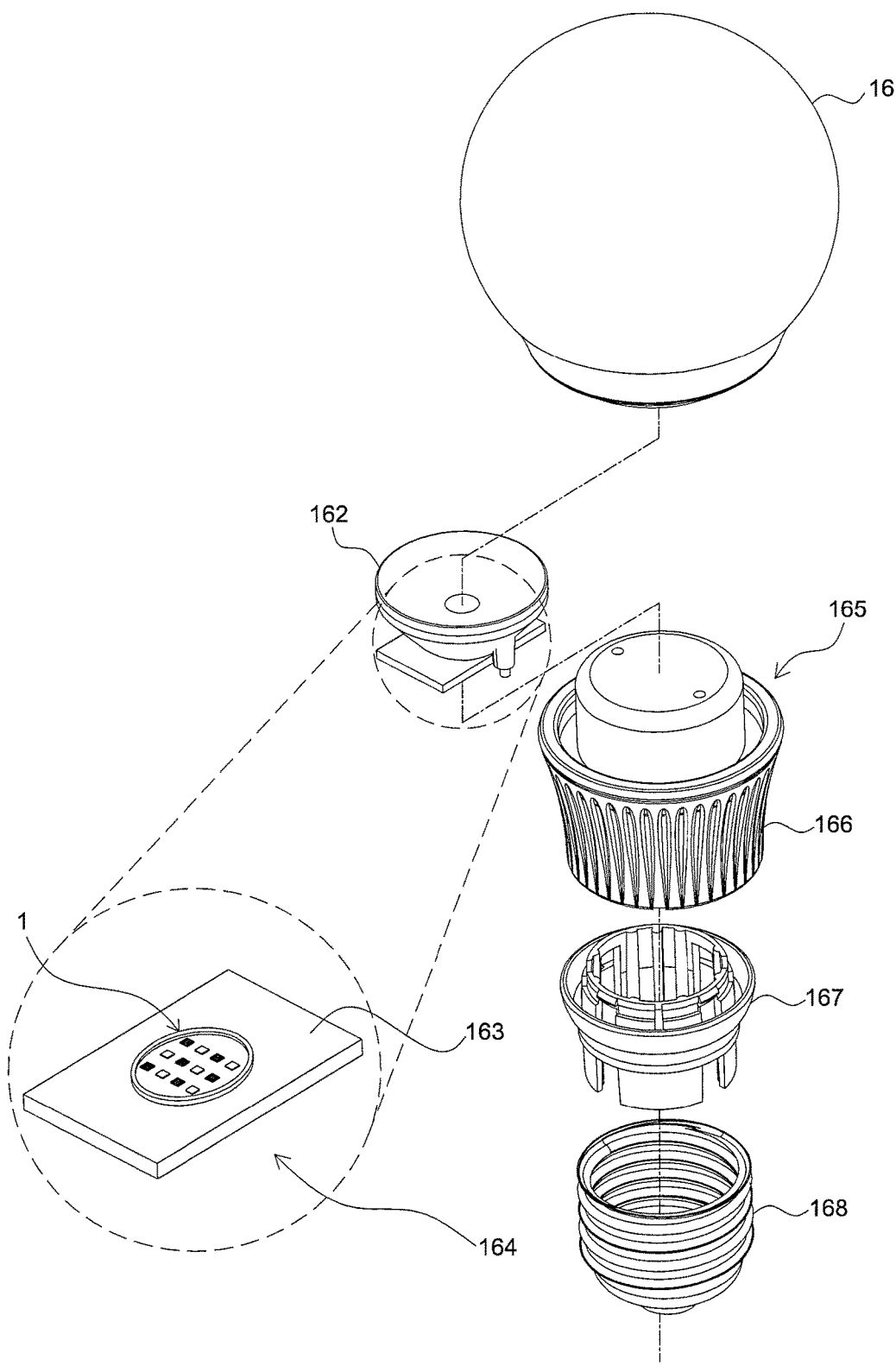
FIG. 3 shows an exploded view of a light bulb in accordance with one of the embodiments of the present application.

FIG. 3 shows an exploded view of a light bulb in accordance with one of the embodiments of the present application. The light-emitting devices 1 as mentioned above are able to combine with other downstream structures to form a light bulb. The light bulb comprises a lamp 161, a lens 162 disposed in the lamp 161, a lighting module 164 disposed under the lens 162, a lamp holder 165 comprising a heat sink 166, wherein the lamp holder 165 is used for holding the lighting module 164, a connecting part 167, and an electrical connector 168, wherein the connecting part 167 connects the lamp holder 165 to the electrical connector 168. The lighting module 164 comprises a carrier 163 and multiple light-emitting devices 1 of any one of the embodiments as mentioned above, wherein the multiple light-emitting devices 1 are on the carrier 163.

In accordance with a further embodiment of the present disclosure, the structures in the embodiments of the present disclosure can be combined or changed. For example, a light-emitting device comprises all the elements mentioned in the above embodiments.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device, comprising:
a semiconductor structure comprising a first conductivity-type semiconductor layer, a second conductivity-type semiconductor layer, a first intermediate layer having a first thickness, a second intermediate layer having a second thickness, and an active region capable of emitting radiation, wherein the active region is between the first intermediate layer and the second intermediate layer, the first intermediate layer is in direct contact with the first conductivity-type semiconductor layer, the second intermediate layer is in direct contact with the second conductivity-type semiconductor layer, and the active region comprises alternated well layers and barrier layers, wherein each barrier layer has a thickness;
wherein a first difference between a refractive index of the first intermediate layer and a refractive index of the first conductivity-type semiconductor layer is less than a second difference between a refractive index of the second intermediate layer and a refractive index of the second conductivity-type semiconductor layer, and the first thickness and the second thickness are both greater than the thickness of one of the barrier layers.

2. The light-emitting device according to claim 1, wherein the radiation mainly escapes from the light-emitting device through the side of the active region where the first intermediate layer and the first conductivity-type semiconductor layer are situated.

3. The light-emitting device according to claim 1, wherein the first conductivity-type semiconductor layer comprises an even portion opposite to the second conductivity-type semiconductor layer.

4. The light-emitting device according to claim 3, wherein the first intermediate layer comprises a bottom surface opposite to the second conductivity-type semiconductor layer, and a distance between the even portion and the bottom surface is not more than 3500 nm.

5. The light-emitting device according to claim 3, wherein the first conductivity-type semiconductor layer comprises a lower surface opposite to the even portion, and a thickness between the even portion and the lower surface of the first conductivity-type semiconductor layer is greater than a thickness of the second conductivity-type semiconductor layer.

6. The light-emitting device according to claim 5, wherein a difference between the thickness between the even portion and the lower surface of the first conductivity-type semiconductor layer and the thickness of the second conductivity-type semiconductor layer is greater than 1000 nm.

7. The light-emitting device according to claim 1, wherein an energy gap of the second conductivity-type semiconductor layer is greater than an energy gap of the first conductivity-type semiconductor layer.

8. The light-emitting device according to claim 1, wherein an energy gap of the first intermediate layer is the same as an energy gap of the second intermediate layer.

9. The light-emitting device according to claim 1, wherein a third difference between an energy gap of the first intermediate layer and an energy gap of the first conductivity-type semiconductor layer is less than a fourth difference between an energy gap of the second intermediate layer and an energy gap of the second conductivity-type semiconductor layer.

10. The light-emitting device according to claim 1, wherein the first conductivity-type semiconductor layer, the second conductivity-type semiconductor layer, the first intermediate layer and the second intermediate layer comprises AlGaInP.

11. The light-emitting device according to claim 1, wherein the semiconductor structure further comprises a buffer layer under the second conductivity-type semiconductor layer, wherein the buffer layer comprises AlGaInP.

12. The light-emitting device according to claim 11, wherein one of the element of the buffer layer has an atomic percentage gradually changed in a direction from the second conductivity-type semiconductor layer toward the first conductivity-type semiconductor layer.

13. The light-emitting device according to claim 1, wherein the first thickness and the second thickness are both greater than the thickness of any barrier layer.

14. The light-emitting device according to claim 1, wherein the first thickness and the second thickness are at least 50 nm greater than the thickness of one of the barrier layers.

15. The light-emitting device according to claim 1, wherein first intermediate layer and the second intermediate are undoped.

16. The light-emitting device according to claim 1, wherein the semiconductor structure further comprises a semiconductor layer under the second conductivity-type semiconductor layer, wherein an energy gap of the semiconductor layer is lower than an energy gap of the second conductivity-type semiconductor layer.

17. The light-emitting device according to claim 16, wherein the semiconductor layer has a thickness greater than a thickness of the second conductivity-type semiconductor layer.

18. The light-emitting device according to claim 1, further comprising a bonding layer under the second conductivity-type semiconductor layer.

19. The light-emitting device according to claim 1, further comprising a reflective layer under the second conductivity-type semiconductor layer.

20. The light-emitting device according to claim 1, further comprising a current spreading layer comprising metal oxide material under the second conductivity-type semiconductor layer.

* * * * *